United States Patent [19]

Fahey

[11] 4,225,792
[45] Sep. 30, 1980

[54] DETECTOR CIRCUIT

[75] Inventor: Robert J. Fahey, Burlington, Mass.

[73] Assignee: GTE Sylvania Incorporated, Stamford, Conn.

[21] Appl. No.: 973,218

[22] Filed: Dec. 26, 1978

[51] Int. Cl.³ .............................................. H02J 9/06
[52] U.S. Cl. ...................................... 307/66; 307/70; 320/14
[58] Field of Search .................... 307/64, 66, 85, 86, 307/87, 130, 140, 150, 303, 350, 359, 362, 70; 320/9, 14, 13

[56] References Cited

U.S. PATENT DOCUMENTS

| 3,573,483 | 4/1971 | White | 307/66 |
| 3,721,887 | 3/1973 | Nickerson | 307/66 |
| 3,766,403 | 10/1973 | Tsutsumi | 307/66 |

Primary Examiner—L. T. Hix
Assistant Examiner—S. D. Schreyer
Attorney, Agent, or Firm—Peter Xiarhos

[57] ABSTRACT

A detector circuit for detecting the loss or reduction of dc power to a dc load and for detecting a low battery voltage condition of a standby battery employed to power the load upon loss or reduction of dc power supplied to the load. The dc voltages for use by the dc load and for charging the battery are derived from a dc power supply circuit with which the detector circuit of the present invention is used.

The detector circuit of the invention includes a first voltage monitoring circuit operative to examine a dc voltage at a predetermined point in the dc power supply circuit and when the value of this dc voltage is less than a predetermined value indicating a loss of power to the dc load to cause a transfer circuit to couple the battery and the dc voltage thereacross to the dc load. Following this coupling operation, the transfer circuit receives the dc voltage coupled from the battery to the load and maintains the battery coupled to the load. The detector circuit further includes a second voltage monitoring circuit operative following the abovementioned coupling operation to examine the value of dc voltage coupled to the dc load from the battery and when the value of the dc voltage is less than a predetermined value to cause the transfer circuit to uncouple the standby battery and the dc voltage thereacross from the dc load.

10 Claims, 3 Drawing Figures

DETECTOR CIRCUIT

CROSS-REFERENCE TO RELATED APPLICATION

In co-pending patent application Ser. No. 973,201, filed concurrently herewith in the name of Robert J. Fahey, entitled DC POWER SUPPLY CIRCUIT, and assigned to the same assignee as the present application, there is disclosed and claimed a dc power supply circuit with which a voltage detector circuit in accordance with the present invention may be employed.

BACKGROUND OF THE INVENTION

The present invention relates to a detector circuit and, more particularly, to a detector circuit for detecting the loss or reduction in dc power supplied to a dc load and for detecting a low battery voltage condition of a standby battery employed to power the load upon loss or reduction of dc power supplied to the load.

There are many applications in which it is desired to supply a dc voltage to a dc load while also having available a standby dc storage source, such as an electrical storage battery, which may be connected to the load in the event the voltage supplied to the load is terminated or reduced in value for some reason, for example, due to a loss of ac line voltage or failure of components used to derive dc voltages from the ac line voltage. In order to effect the transfer of the battery voltage to the load, it is generally necessary to provide some means, for example, in the form of detection circuitry, which detects the loss or failure of ac line voltage or of the dc voltage supplied to the load and thereupon automatically connects the battery to the load for utilization by the load in place of the original dc source. It may be further desirable following such a transfer operation, and especially after the battery has been in service for an extended period of time, to monitor the voltage of the battery and when the voltage of the battery has declined to a predetermined critical value to disconnect the battery from the load. This latter operation may be necessary to prevent permanent damage to the battery and also in those cases in which the dc load includes apparatus, such as microprocessor apparatus (e.g., of the MOS type), which has critical operating voltages below which the apparatus cannot function in the desired, efficient, error-free fashion.

The present invention is directed to simple, lowcost detection circuitry capable of satisfying the above mentioned considerations and requirements.

SUMMARY OF THE INVENTION

In accordance with the present invention a detector circuit is provided for use with a dc power supply circuit for detecting the loss of dc power to a dc load and for detecting a low dc voltage condition of a standby storage device employed to power the dc load following a loss of dc power to the dc load. The dc power supply circuit is operative to supply dc voltages to the dc load and to the standby storage device for utilization by the dc load and for establishing a dc voltage across the standby storage device.

The detector circuit in accordance with the invention generally includes a transfer circuit means and first and second voltage monitoring circuit means. The transfer circuit means is coupled to the standby storage device and to the dc load and is adapted to receive dc voltages supplied to the dc load. The transfer circuit means has a first operating state during which it couples the standby storage device and the dc voltage thereacross to the dc load and a second operating state during which it uncouples the standby storage device and the dc voltage thereacross from the dc load.

The first monitoring circuit means is coupled to the dc power supply circuit and to the transfer circuit means and is arranged to examine a dc voltage at a predetermined point in the dc power supply circuit. The first voltage monitoring circuit operates when the dc voltage examined thereby has a value less than a predetermined value indicating a loss of power to the dc load to cause the transfer circuit means to operate in its first state whereby the standby storage device and the voltage thereacross are coupled to the dc load for utilization by the dc load. The transfer circuit means operates following the coupling of the standby storage device to the dc load to receive the dc voltage coupled from the standby storage device to the dc load and, in response thereto, to remain in its first state whereby the standby storage device and the dc voltage thereacross remain coupled to the dc load.

The second monitoring circuit means is coupled to the dc load and to the transfer circuit means and is arranged to examine the dc voltage coupled from the standby storage device to the dc load following the aforesaid operation of the first voltage monitoring circuit means and transfer circuit means. The second voltage monitoring circuit means operates when the dc voltage monitored thereby has a value less than a predetermined value to cause the transfer circuit means to operate in its second state whereby the standby storage device and the dc voltage thereacross are uncoupled from the dc load.

BRIEF DESCRIPTION OF THE DRAWING

Various objects, features and advantages of a detector circuit in accordance with the invention will be apparent from the following description taken in conjunction with the accompanying drawing in which.

DETAILED DESCRIPTION OF THE INVENTION

Figure 1:
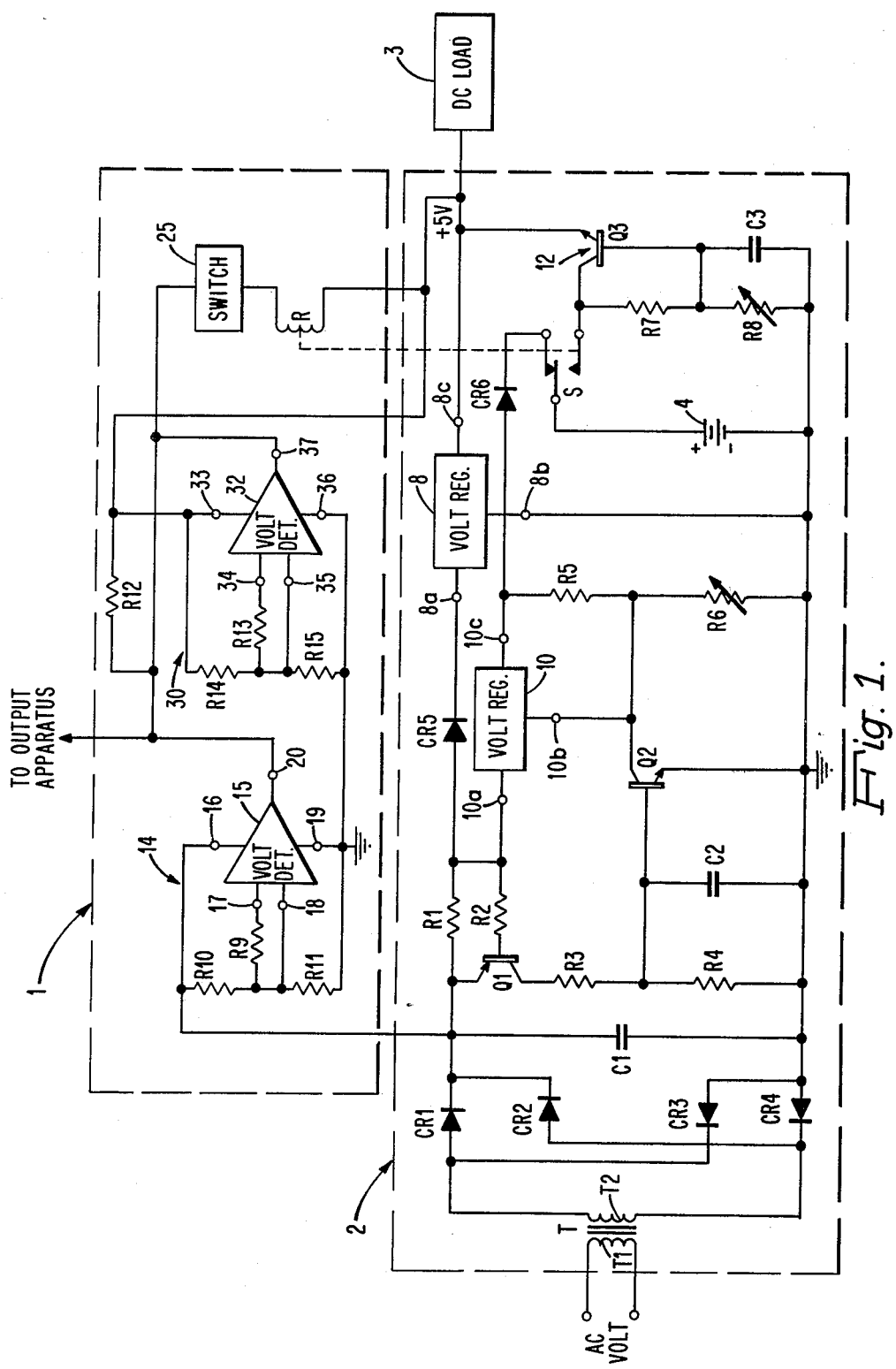
FIG. 1 is a schematic diagram of a detector circuit as employed in conjunction with a dc power supply circuit in accordance with the present invention.

Referring now to FIG. 1, there is shown a schematic diagram of a detector circuit 1 as employed in conjunction with a dc power supply circuit 2 in accordance with the present invention. The dc power supply circuit 2 is adapted to simultaneously supply dc voltages to a dc load 3 and also to a standby battery 4. The dc load 3 is a variable-current load and typically includes components, such as relays and integrated circuits (e.g., including microprocessor apparatus), which have varying power demands and/or duty cycles as a result of which the current drawn by the dc load 3 varies over a wide range of values. The standby battery 4 is of a rechargeable type and is adapted to be charged to a desired maximum value and, as will be described in detail hereinafter, to be automatically coupled to the dc load 3 by the detector circuit 1 upon the loss or reduction of dc voltage to the dc load 3. In addition to connecting the standby battery 4 with the dc load 3 upon the loss or reduction of dc voltage to the load 3, the detector circuit 1 also serves to monitor continuously the value of dc voltage coupled from the battery 4 to the load 3 and, when the value of this voltage declines to a predetermined critical level, to disconnect the battery 4 from the load 3. This latter operation is considered necessary to prevent permanent damage to the battery 4 and also in those cases in which the dc load 3 includes apparatus such as microprocessor apparatus, especially of the MOS type, which has critical operating voltages below which the apparatus cannot function in a desired, efficient, error-free fashion. In this latter instance it is preferred to completely deny operating voltages to the microprocessor apparatus rather than risk improper operation thereof.

The dc power supply circuit 2 as shown in FIG. 1 is described in detail and claimed in the aforementioned application of Robert R. Fahey. However, in order to gain a complete understanding of the detector circuit 1 and its manner of interaction and cooperation with the dc power supply circuit 2, the dc power supply circuit 2 will be described briefly herein. It will be appreciated, however, that the detector circuit 1 of the present invention is also capable of use with dc power supply circuits of designs differing from the particular dc power supply circuit 2 shown in FIG. 1 and described in the aforementioned co-pending application.

The dc voltages for operating the dc load 3 and for charging the battery 4 are derived from an ac input voltage applied across a primary winding T1 of a step-down transformer T. The ac voltage, which may be a 110-volt ac line voltage, is stepped down by the transformer T and presented across a secondary winding T2. The stepped-down ac voltage is then converted to a dc voltage by a full-wave bridge rectifier circuit 7, comprising four diodes CR1–CR4, and filtered by a capacitor C1. The dc voltage established across the capacitor C1 is employed both to derive a fixed dc supply voltage for the dc load 3, for example, 5 volts dc, and also to derive dc voltages for charging the standby battery 4 to a desired voltage, for example, about 6.5 volts.

The fixed dc voltage for the load 3 is derived from the voltage across the capacitor C1 by means including a voltage regulator circuit 8. The voltage regulator circuit 8 supplies an initial fixed dc voltage to the load 3, specifically, 5 volts dc, and, as the load 3 draws varying amounts of current over its operating range, for example, between a minimum of 450 ma and a maximum of 900ma, the current variations are sensed by a current-sensing resistor R1, causing variations in the value of dc voltage applied to an input terminal 8a of the voltage regulator circuit 8. The voltage regulator circuit 8, which is of a so-called fixed type by virtue of a control input terminal 8b thereof being placed at a fixed potential, for example, ground potential, regulates the varying voltage at its input terminal 8a to a fixed value of 5 volts dc at an output terminal 8c thereof.

As the regulated fixed dc voltage (5 volts) is suplied to the dc load 3, a dc battery-charging voltage is also supplied to the standby battery 4 by an adjustable voltage regulator circuit 10. The adjustable voltage regulator circuit 10 receives a dc voltage from the capacitor C1 at an input terminal 10a and operates in conjunction with a pair of transistors Q1 and Q2 and a plurality of resistors R2–R6 to control the dc voltage supplied to, and the current drawn by, the battery 4. More particularly, as the load 3 and the battery 4 draw current, the aforementioned components operate to increase or decrease the value of voltage at a control input terminal 10b of the voltage regulator circuit 10 in accordance with the variations in the current drawn by the load 3 and the battery 4. As a result, corresponding variations are produced in the value of the voltage at an output terminal 10c of the voltage regulator circuit 10 and, thus, the value of the current supplied to the battery 4. The transistors Q1 and Q2 and the resistors R2–R6 further operate, in conjunction with the current-sensing resistor R1 and the voltage regulator circuit 10, to limit the current to the battery 4 so that the maximum combined value of current drawn by the load 3 and the battery 4 does not exceed some prescribed value, for example, one ampere. The one ampere limitation serves to protect components such as the transformer T from being damaged or destroyed. As described in the co-pending application of Fahey, this maximum value of current of one ampere is further apportioned between the load 3 and the battery 4 with the load 3 being supplied first and at all times with its particular current needs and the remainder, that is, the difference between the current drawn by the load 3 and one ampere, being made available to the battery 4 for charging purposes. This preferential situation arises since the needs of the load 3 are of a short-term nature, that is, more or less immediate, while the charging of the battery 4 to its desired value is a comparatively long-term consideration, for example, 24 hours, and to be utilized upon a loss or reduction of dc power supplied to the load 3.

Figure 2:
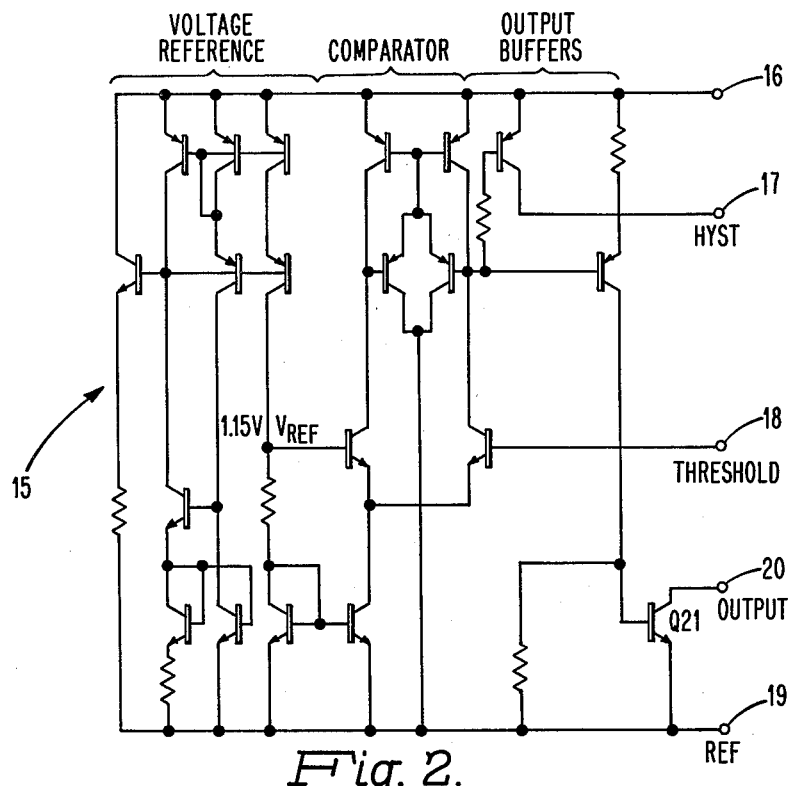
FIGS. 2 and 3 are schematic diagrams of voltage detectors employed in the detector circuit in accordance with the present invention.

The transfer of the voltage developed across the battery 4 to the load 3 upon the loss or reduction of power to the load 3 is accomplished in accordance with the present invention by a first voltage monitoring circuit 14 included in the aforementioned detector circuit 1. The voltage monitoring circuit 14 includes a voltage detector 15 of a form as shown in detail in FIG. 2. As shown in FIGS. 1 and 2, the voltage detector 15 has a voltage input terminal 16, a hysteresis output terminal 17, a threshold input terminal 18, a reference terminal 19, and an output terminal 20. The voltage input terminal 16 is connected to the top end of the capacitor C1 of the dc power supply circuit 2 and is adapted to receive the dc voltage developed across the capacitor C1. The hysteresis output terminal 17 is coupled via a feedback resistor R9 to the juncture of a pair of resistors R10 and R11, and the threshold input terminal 18 is connected directly to the juncture of the resistors R10 and R11. The resistors R10 and R11 constitute a voltage divider and, as shown in FIG. 1, are coupled between the top end of the capacitor C1 and ground potential. These resistors are arranged to receive the voltage across the capacitor C1 and, when the voltage across the capacitor C1 and, thus, at the input terminal 16, is of a predetermined critical value, for example, +9.5 volts dc, to establish a voltage at the threshold terminal 18 which is equal to an internal threshold voltage of the voltage detector 15, for example, 1.15 volts dc. To this end, the resistors R10 and R11 are selected to have values such that the ratio of these values (R10/R11) is essentially equal to the ratio of 9.5 volts to 1.15 volts.

The reference terminal 19 of the voltage detector 15 is connected directly to a source of reference potential, such as ground potential, and the output terminal 20 is connected via a switch 25, for example, a Darlington switch circuit, to one end of a relay winding R. The opposite end of the relay winding R is coupled to the input of the dc load 3. The output terminal 20 of the voltage detector 15 is also connected via a resistor R12 to the input of the dc load 3 so that the dc voltage received by the load 3 is applied to one end of the resistor R12.

The voltage monitoring circuit 14 as described above operates in the following manner. When the dc voltage established across the capacitor C1 is of a sufficiently high value for use by the load 3 and the battery 4, for example, above +9.5 volts dc, this voltage is coupled directly to the input terminal 16 of the voltage detector 15 and also reduced in value by the resistors R10 and R11 and applied to the threshold input terminal 18. Since the value of the reduced voltage at the threshold input terminal 18 is greater at this time than the value of the internal threshold voltage (1.15 volts dc) of the voltage detector 15, an output transistor Q21 connected between the output terminal 20 and the reference terminal 19 as shown in FIG. 2 is caused to conduct and thereby connect the output terminal 20 to ground potential. As a result, the 5-volt signal produced by the voltage regulator circuit 8 and applied to the load 3 is also coupled to the resistor R12 and causes current to flow through the resistor R12 and through the conducting transistor Q21 (between terminals 19 and 20) to ground potential. The flow of current through the resistor R12 to ground potential serves to rob, or deny, the switch 25 of input current as a result of which the switch 25 acts as an open circuit and prevents the relay winding R, which controls a switch S in the dc power supply circuit 2, from being energized by the 5-volt signal present at the input of the dc load 3. With the relay winding R in its de-energized state, the switch S remains in a first position as shown in FIG. 1 and there is no transfer or coupling of the voltage developed across the battery 4 to the load 3.

If the value of the dc voltage developed across the capacitor C1 should drop below the abovementioned 9.5 volts, for example, due to a loss of the input ac voltage or failure of some circuit components, this voltage condition, which leads to a loss or reduction in the power to the load 3, is detected by the voltage monitoring circuit 14. Specifically, when the dc voltage across the capacitor C1 is below 9.5 volts, this voltage is applied to the input terminal 16 of the voltage detector 15 and the voltage-divider resistors R10 and R11 serve to establish a dc voltage at the threshold input terminal 18 of the voltage detector 15 which is of a value less than the value of the internal threshold voltage (1.15 volts) of the voltage detector 15. As a result, the aforementioned transistor Q21 connected between the terminals 19 and 20 is caused to operate in its non-conducting state, thereby causing the output terminal 20 to be placed above ground potential.

With the output terminal 20 of the voltage detector 15 above ground potential, the aforedescribed current path through the resistor R12 to ground potential is no longer present and, instead, a new current path is established through the resistor R12 to the input of the switch 25 by means of the dc voltage present at the input of the dc load 3 (and applied to the resistor R12). The switch 25 operates in response to the current received at its input to be placed in a "closed" state, thereby allowing the relay winding R to be energized. The energization of the relay winding R causes the aforementioned switch S to move from its first position as shown in FIG. 1 to a second position. With the switch S in its second position, the battery 4 is coupled to a simple voltage regulator circuit 12 (comprising an npn transistor Q3, resistors R7 and R8 and a capacitor C3) and the dc voltage across the battery 4 is regulated by the voltage regulator circuit 12 to a fixed value of +5 volts and applied to the input of the dc load 3. This regulated dc voltage then serves to maintain the relay winding R in its energized state. It is to be appreciated that the energization of the relay winding R as discussed hereinabove occurs rapidly and, in any event, occurs before the dc voltage supplied to the dc load 3 by the voltage regulator circuit 8 has dropped, as a result of the discharge of the capacitor C1, to a value of voltage which would prevent sufficient current from being applied to the switch 25.

Once the battery 4 has been coupled to the input of the dc load 3 as described hereinabove, it may be used to power the dc load 3 over a period of time as determined by the value of the dc voltage developed across the battery 4. A fully charged battery 4 might be used, for example, for a period of up to 6 hours. However, should the value of the dc voltage across the battery 4 decline over a period of time so that the battery voltage coupled to the dc load 3 via the voltage regulator circuit 12 reaches a critical level, for example, below +4.5 volts dc, it may become necessary, in order to prevent damage to the battery 4 or improper operation of components of the dc load 3 (e.g., MOS integrated circuits), to disconnect the battery 4 from the dc load 3. This disconnect operation is achieved in accordance with the present invention by means of a second voltage monitoring circuit 30. The voltage monitoring circuit 30 serves to continuously monitor the value of the dc battery voltage coupled to the load 3 and, when the value of this voltage drops to a critical level, specifically, below 4.5 volts, to disconnect the battery 4 from the dc load 3.

Figure 3:
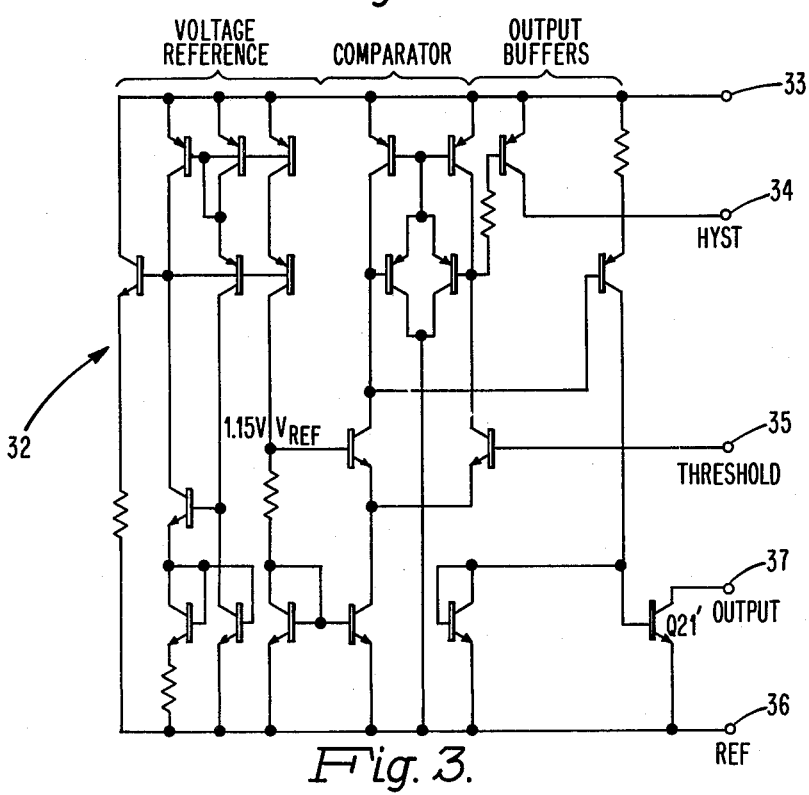

The voltage monitoring circuit 30 includes a voltage detector 32 of a form as shown in detail in FIG. 3. As shown in FIGS. 1 and 3, the voltage detector 32 has a voltage input terminal 33, a hysteresis output terminal 34, a threshold input terminal 35, a reference terminal 36, and an output terminal 37. The voltage input terminal 33 is connected to the input of the dc load 3 and is adapted to receive the regulated dc battery voltage applied to the input of the load 3. The hysteresis output terminal 34 is coupled via a feedback resistor R13 to the juncture of a pair of resistors R14 and R15, and the threshold input terminal 35 is connected directly to the juncture of the resistors R14 and R15. The resistors R14 and R15 constitute a voltage divider and, as shown in FIG. 1, are coupled between the input of the dc load 3 and ground potential. These resistors are arranged to receive the regulated battery voltage as applied to the load 3 and, when the value of this voltage is below a predetermined critical level, for example, 4.5 volts dc, to establish a voltage at the threshold terminal 35 which is equal to an internal threshold voltage of the voltage detector 32, for example, 1.15 volts dc. As in the case of the voltage-divider resistors R10 and R11 associated with the voltage detector 14, the resistors R14 and R15 are selected to have values such that the ratio of these values (R14/R15) is essentially equal to the ratio of 4.5 volts to 1.15 volts.

The reference terminal 36 of the voltage detector 32 is connected directly to ground potential, and the output terminal 37 is connected via the aforementioned switch 25 and relay winding R, and also via the aforementioned resistor R12, to the input of the dc load 3.

The voltage monitoring circuit 30 as described above operates in the following manner. When the regulated battery voltage applied to the dc load 3 is above 4.5 volts, indicating that the voltage across the battery 4 is of sufficient value for use by the dc load 3, this regulated dc voltage is coupled directly to the input terminal 33 of the voltage detector 32 and also reduced in value by the resistors R14 and R15 and applied to the threshold input terminal 35. Since the value of the reduced voltage at the threshold input terminal 35 is greater at this time than the value of the internal threshold voltage (1.15 volts dc) of the voltage detector 32, an output transistor $Q21^1$ connected between the output terminal 37 and the reference terminal 36 as shown in FIG. 3 is caused to operate in its non-conducting state. As a result, the regulated battery voltage at the input of the dc load 3 causes a current path to be established via the resistor R12 to the input of the switch 25. This current flow into the switch 25 serves to maintain the switch 25 in its "closed" state, thereby maintaining the relay winding R in its energized state and the switch S in its second position.

If the value of the regulated battery voltage applied to the dc load 3 drops below the abovementioned 4.5 volts, for example, due to prolonged use of the battery 4 resulting in a reduction of the voltage thereacross, this voltage condition is detected by the voltage monitoring circuit 30. Specifically, when the regulated battery voltage applied to the dc load 3 is below 4.5 volts, this voltage is applied to the input terminal 33 of the voltage detector 32 and the voltage-divider resistors R14 and R15 serve to establish a dc voltage at the threshold input terminal 35 of the voltage detector 32 which is of a value less than the value of the internal threshold voltage (1.15 volts) of the voltage detector 32. As a result, the aforementioned transistor $Q21^1$ is caused to operate in its conducting state thereby causing the output terminal 37 to be placed at ground potential and establishing a current path via the resistor R12 and the terminals 37 and 36 to ground potential. This current path through the resistor R12 to ground potential serves to rob, or deny, the switch 25 of current at its input as a result of which the relay winding R is caused to change from its energized state to its previous de-energized state. The de-energization of the relay winding R in turn causes the switch S to move from its second position back to its original, first position as shown in FIG. 1. With the switch S back in its first position, the battery 4 is disconnected from the dc load 3 and once again restored to its place within the power supply circuit 2 in readiness to be recharged upon the restoration of ac power or correction of any malfunctioning component responsible for the original loss or reduction of dc power to the load 3.

From the above discussion it will be appreciated that the voltage detectors 15 and 32 have opposite output states in their respective failure modes, that is, the output transistor Q21 (FIG. 2) of the voltage detector 15 operates in its non-conducting state when in its power failure detection mode and the output transistor $Q21^1$ (FIG. 3) of the voltage detector 32 operates in its conducting state when in its low battery voltage detection mode. These opposing conduction states in the transistors Q21 and $Q21^1$ make it possible, using voltage detectors of similar design and a common resistor R12, to achieve opposite control states for the relay winding R, that is, energization of the relay winding R in response to a power loss and deenergization of the relay winding R in response to a low battery voltage condition. The use of the voltage detectors 15 and 32 of similar design accordingly leads to a voltage detector circuit 1 of minimum complexity and low cost.

As indicated in FIG. 1, the output of the voltage detector 15, in addition to being used to control the switch 25 and the energization of the relay winding R, may also be used by suitable output apparatus or, although not shown in FIG. 1, by the dc load 3 itself, for informing the output apparatus or components within the load 3 (e.g., a microprocessor) of the occurrence of power failures. The output apparatus or the load 3 may then utilize these indications in any desired or suitable manner. The voltage detectors 15 and 32 as described hereinabove and shown in FIGS. 2 and 3, respectively, are described in detail in a publication of the Intersil Corp., Cupertino, California, entitled "Analog Products Catalog", Volume II, pages 63–72. In this publication, the trade designation for the voltage detector 15 is ICL8212 and the trade designation for the voltage detector 32 is ICL8211.

Some values of components which may be employed in the detector circuit 1 are as follows:

R9: 1 Megohm
R10: 180 Kilohms
R11: 22 Kilohms
R12: 3.3 Kilohms
R13: 1 Megohm
R14: 220 Kilohms
R15: 82 Kilohms
Switch 25: MPS-A13, Motorola (npn Darlington transistor)

While there has been described what is considered to be a preferred embodiment of the invention it will be apparent to those skilled in the art that various changes and modifications may be made therein without departing from the invention as called for in the appended claims.

What is claimed is:

1. A detector circuit for use with a dc power supply circuit for detecting the loss of dc power to a dc load and for detecting a low dc voltage condition of a standby storage device employed to power the dc load following a loss of dc power to the dc load, said dc power supply circuit being operative to supply dc voltages to the dc load and to the standby storage device for utilization by the dc load and for establishing a dc voltage across the standby storage device, said detector circuit comprising:

transfer circuit means coupled to the standby storage device and to the dc load and adapted to receive dc voltages supplied to the dc load by the dc power supply circuit and the standby storage device, said transfer circuit means having a first operating state during which it couples the standby storage device and the dc voltage thereacross to the dc load and a second operating state during which it uncouples the standby storage device and the dc voltage thereacross from the dc load;

first voltage monitoring circuit means including power failure detector circuit means coupled to a predetermined point in the dc power supply circuit and to the transfer circuit means and having a first terminal at a predetermined reference potential and a second terminal, said power failure detector circuit means being operative to examine a dc voltage at the predetermined point in said dc power supply circuit and operative when the dc voltage examined thereby has a value less than a predetermined value indicating a loss of power to the dc load to place the second terminal at a potential above the predetermined reference potential of the first terminal;

said transfer circuit means being operative in response to the placement of the second terminal of the power failure detector circuit means above the reference potential of the first terminal to receive the dc voltage then present at the dc load and, in response to said dc voltage, to operate in its first state and thereby couple the standby storage device and the dc voltage thereacross to the dc load, said transfer circuit means being thereafter operative to receive the dc voltage coupled from the standby storage device to the dc load and, in response thereto, to continue to operate in its first state and thereby maintain the standby storage device and the dc voltage thereacross coupled to the dc load; and second voltage monitoring circuit means coupled to the dc load and to the transfer circuit means and arranged to examine the dc voltage coupled from the standby storage device to the dc load following the aforesaid operation of the first voltage monitoring circuit means and transfer circuit means, said second voltage monitoring circuit means being operative when the dc voltage monitored thereby has a value less than a predetermined value to cause the transfer circuit means to operate in its second state whereby the standby storage device and the dc voltage thereacross are uncoupled from the dc load.

2. A detector circuit in accordance with claim 1 wherein:

the second voltage monitoring circuit means comprises:

low-voltage detector circuit means coupled to the dc load and to the transfer circuit means and having a first terminal at a predetermined reference potential and a second terminal, said low-voltage detector circuit means being operative to examine the dc voltage coupled from the standby storage device to the dc load following operation of the first voltage monitoring circuit means and the transfer circuit means and when the dc voltage monitored thereby has a value less than a predetermined value to place the second terminal at the predetermined reference potential of the first terminal;

said transfer circuit means being operative in response to the placement of the second terminal of the low-voltage detector circuit means at the predetermined reference potential of the first terminal to receive the dc voltage then present at the dc load and, in response to said dc voltage, to operate in its second state and thereby uncouple the standby storage device and the dc voltage thereacross from the dc load.

3. A detector circuit in accordance with claim 2 wherein:

the transfer circuit means comprises:

resistance means having a first end coupled to the second terminals of the power failure detector circuit means and the low-voltage detector circuit means and a second end coupled to the dc load; and control means coupled between the first end of the resistance means and the dc load and also to the standby storage device, said control means having an input and being operative in response to current received at its input to operate in a first state and to couple the standby storage device and the dc voltage thereacross to the dc load, and operative in response to current being denied at its input to operate in a second state and to uncouple the standby storage device and the dc voltage thereacross from the dc load;

said resistance means being operative when the second terminal of the power failure detector circuit means has been placed at a potential above the predetermined reference potential of the first terminal in response to the dc voltage examined by the power failure detector circuit means having a value less than the predetermined associated value indicating a loss of power to the dc load to receive the dc voltage then present at the dc load and, in response thereto, to conduct current therethrough to the input of the control means thereby causing the control means to couple the standby storage device and the dc voltage thereacross to the dc load, said resistance means being further operative following the coupling of the standby storage device to the dc load to receive the dc voltage coupled from the standby storage device to the dc load and, in response thereto, to continue to conduct current therethrough to the input of the control means thereby to cause the control means to continue to operate in its first state and to maintain the standby storage device and the dc voltage thereacross coupled to the dc load;

said resistance means being further operative following the coupling of the standby storage device and the dc voltage thereacross to the dc load and when the second terminal of the low-voltage detector circuit means has been placed at the potential of the first terminal in response to the dc voltage examined by the low-voltage detector circuit means having a value less than the predetermined associated value to receive the dc voltage then present at the dc load and, in response thereto, to conduct current therethrough and between the second and first terminals of the low-voltage detector circuit means to the reference potential of the first terminal, said current flow denying current to the input of the control means thereby causing the control means to operate in its second state and to uncouple the standby storage device and the dc voltage thereacross from the dc load.

4. A detector circuit in accordance with claim 3 wherein:

the standby storage device is an electrical storage battery.

5. A detector circuit in accordance with claim 4 wherein:

the power failure detector circuit means further includes a transistor coupled between the first and second terminals thereof, said transistor being operative when the dc voltage examined by the power failure detector circuit means has a value less than the predetermined associated value indicating a loss of dc power to the dc load to be placed in a non-conducting state thereby placing the second terminal of the power failure detector circuit means at a potential above the reference potential of the first terminal; and the low-voltage detector circuit means further includes a transistor coupled between the first and second terminals thereof, said transistor being operative when the dc voltage examined by the low-voltage detector circuit means following the transfer of the standby storage device and the dc voltage thereacross to the dc load has a value less than the predetermined associated value to be placed in a conducting state thereby placing the second terminal of the low-voltage detector circuit means at the reference potential of the first terminal.

6. A detector circuit in accordance with claim 3 wherein:
   the control means comprises:
      switch means having an input coupled to the first end of the resistance means, said switch means being operative in a first state in response to current received at its input from the resistance means, and operative in a second state in response to the absence of current at its input; and
      relay means coupled to the switch means, to the dc load and to the standby storage device, said relay means being operative in response to the switch means operating in its first state to couple the standby storage device and the dc voltage thereacross to the dc load and operative in response to the switch means operating in its second state to uncouple the standby storage device and the dc voltage thereacross from the dc load.

7. A detector circuit in accordance with claim 6 wherein:
   the relay means comprises:
      relay winding means coupled between the switch means and the dc load, said relay winding means being operable in an energized state in response to the switch means operating in its first state, and operable in a de-energized state in response to the switch means operating in its second state; and
      second switch means associated with the relay winding means and coupled to the standby storage device, said second switch means having a first operating position in which the standby storage device is maintained within the dc power supply circuit and a second operating position in which the standby storage device is uncoupled from the dc power supply circuit, said second switch means being operative when the relay winding means is in an energized state to be placed in its second position and to couple the standby storage device and the dc voltage thereacross to the dc load, and operative when the relay winding means is in a de-energized state to be placed in its first position and to uncouple the standby storage device and the dc voltage thereacross from the dc load and to be returned to its position within the dc power supply circuit.

8. A detector circuit in accordance with claim 7 wherein:
   the first voltage detector circuit means further includes a transistor coupled between the first and second terminals thereof, said transistor being operative when the dc voltage examined by the first voltage detector circuit means has a value less than the predetermined associated value indicating a loss of dc power to the dc load to be placed in a non-conducting state thereby placing the second terminal of the first voltage detector circuit means at a potential above the reference potential of the first terminal; and
   the second voltage detector circuit means further includes a transistor coupled between the first and second terminals thereof, said transistor being operative when the dc voltage examined by the second voltage detector circuit means following the transfer of the standby storage device and the dc voltage thereacross to the dc load has a value less than the predetermined associated value to be placed in a conducting state thereby placing the second terminal of the second voltage detector circuit means at the reference potential of the first terminal.

9. A detector circuit in accordance with claim 8 wherein:
   the switch means included in the control means includes a Darlington switch.

10. A detector circuit in accordance with claim 9 wherein:
    the standby storage device includes an electrical storage battery.

* * * * *